US007783846B2

(12) United States Patent  (10) Patent No.: US 7,783,846 B2
Chainer  (45) Date of Patent: Aug. 24, 2010

(54) METHOD, APPARATUS AND COMPUTER PROGRAM PRODUCT PROVIDING ENERGY REDUCTION WHEN STORING DATA IN A MEMORY

(75) Inventor: Timothy Chainer, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 418 days.

(21) Appl. No.: 11/836,210

(22) Filed: Aug. 9, 2007

(65) Prior Publication Data

US 2009/0043944 A1  Feb. 12, 2009

(51) Int. Cl.
G06F 12/12 (2006.01)
(52) U.S. Cl. ...................................................... 711/159
(58) Field of Classification Search ........................ None
See application file for complete search history.

(56) References Cited

U.S. PATENT DOCUMENTS

| 5,873,112 | A | * | 2/1999 | Norman | 711/103 |
| 6,292,868 | B1 | | 9/2001 | Norman | 711/103 |
| 6,633,951 | B2 | | 10/2003 | Cohen | 711/105 |
| 2002/0188798 | A1 | * | 12/2002 | Kumaki et al. | 711/104 |
| 2003/0009617 | A1 | | 1/2003 | Cohen | 711/105 |
| 2004/0042292 | A1 | * | 3/2004 | Sakata et al. | 365/202 |
| 2006/0259716 | A1 | * | 11/2006 | Moschopoulos | 711/156 |

FOREIGN PATENT DOCUMENTS

EP  0 917 154  5/1999

OTHER PUBLICATIONS

"A High Performance Modular Embedded ROM Architecture", Marcello Duhalde, et al., IEEE 1995, pp. 1057-1060.
"Power Reduction Scheme with Data-Dependent Write", IBM Technical Disclosure Bulletin vol. 30, No. 1, Jun. 1987, pp. 304-305.
"Reduced Power for High Performance Memory", IEEE, pp. 415-416.

* cited by examiner

*Primary Examiner*—Tuan V Thai
*Assistant Examiner*—Duc T Doan
(74) *Attorney, Agent, or Firm*—Harrington & Smith

(57) ABSTRACT

A method is disclosed to operate a memory device. The method includes, prior to overwriting a first unit of data at a location in a memory device with a second unit of data, determining if more energy is required to write the second unit of data than to write the second unit of data with at least one sub-unit thereof having bits that are inverted. If it is determined that less energy is required to write the second unit of data with the at least one sub-unit thereof having bits that are inverted, the method further includes overwriting the first unit of data with a modified second unit of data with the at least one sub-unit thereof having bits that are inverted, in conjunction with writing at least one bit memory for indicating a location in the modified unit of data of the sub-unit of data having the inverted bits.

35 Claims, 6 Drawing Sheets

| Current Data | Input Data | Xor Current/ Input Data | Sum of Xor | Negate Input Data | Xor Current/ Negate Input | Sum Xor +1 | Diff |
|---|---|---|---|---|---|---|---|
| 0 | 250 | 250 | 6 | 5 | 5 | 3 | -3 |
| 0 | 251 | 251 | 7 | 4 | 4 | 2 | -5 |
| 0 | 252 | 252 | 6 | 3 | 3 | 3 | -3 |
| 0 | 253 | 253 | 7 | 2 | 2 | 2 | -5 |
| 0 | 254 | 254 | 7 | 1 | 1 | 2 | -5 |
| 0 | 255 | 255 | 8 | 0 | 0 | 1 | -7 |

FIG. 3B

4A: Prior To Overwriting A First Unit Of Data At A Location In A Memory Device With A Second Unit Of Data, Determining If More Energy Is Required To Write The Second Unit Of Data Than To Write The Second Unit Of Data With At Least One Sub-Unit Thereof Having Bits That Are Inverted 4B: If It Is Determined That Less Energy Is Required To Write The Second Unit Of Data With The At Least One Sub-Unit Thereof Having Bits That Are Inverted, Overwriting The First Unit Of Data With A Modified Second Unit Of Data With The At Least One Sub-Unit Thereof Having Bits That Are Inverted, In Conjunction With Writing At Least One Bit For Indicating A Location In The Modified Unit Of Data Of The Sub-Unit Of Data Having The Inverted Bits

FIG. 4

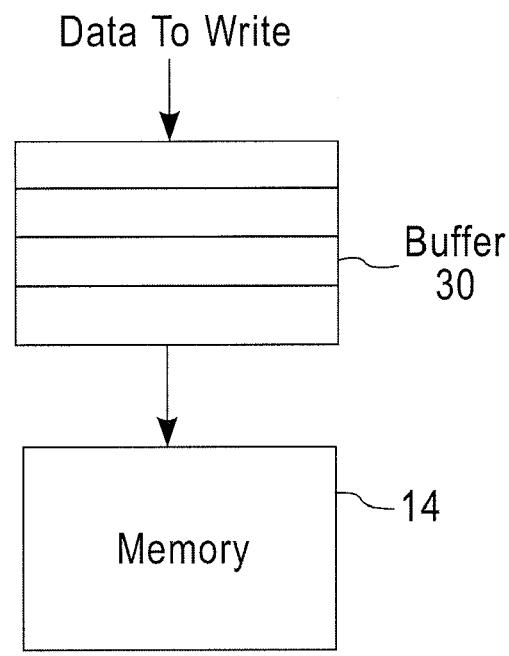

FIG. 5

METHOD, APPARATUS AND COMPUTER PROGRAM PRODUCT PROVIDING ENERGY REDUCTION WHEN STORING DATA IN A MEMORY

CROSS-REFERENCE TO RELATED APPLICATIONS

The present application is related to U.S. patent application Ser. No. 11/836,212, filed Aug. 9, 2007, entitled "Method, Apparatus and Computer Program Product Providing Instruction Monitoring for Reduction of Energy Usage"; the disclosure of which is incorporated by reference herein in its entirety.

TECHNICAL FIELD

The exemplary embodiments of this invention relate generally to data storage and retrieval and, more specifically, to energy efficient techniques for storing data in a computer readable medium.

BACKGROUND

In US Patent Publication US 2004/0042292 A1 Sakata et al. disclose a write operation of a MRAM, where a current necessary for inverting magnetization of an MTJ element has to be passed through a data line resulting in large current consumption. The write operation includes comparing input data with read data read from a memory cell array and encoding the input data to form write data using a data encoder. Also disclosed is the decoding read data using a data decoder to form output data. In a nonvolatile semiconductor memory the number of bits to be written during the write operation is reduced, and the current consumption is also said to be reduced.

In U.S. Pat. No. 6,633,951 Cohen discloses a method and apparatus for reducing the power needed in a computing system to refresh dynamic random access memory. In one embodiment data to be stored to DRAM is evaluated one word at a time. For each eight-bit data word, if the number of ones is more than four, each bit of the data word is inverted and a data inversion indicator bit is set to a logic one, to indicate that the data has been inverted. This allows for the data to be stored accurately with the minimum number of ones present. Due to the power required to refresh ones stored in DRAM, storing a minimum number of ones reduces power consumption. A read of the data determines if the data had been inverted upon storage and, if so, the read data is reverted to its original form.

In U.S. Pat. No. 5,873,112 Norman discloses a method and system in which X-bit packets of bits (where X is an integer) are encoded to generate X-bit packets of encoded bits for writing to erased cells of a flash memory array, where less power is consumed to write a bit having a first value to an erased cell than to write a bit having a second value to the cell. A count signal is generated for each packet of raw bits indicating the number of bits of the packet having the first (or second) value, the count signal is processed to generate a control signal which determines an encoding for the packet, and the raw bits of the packet are encoded according to a scheme determined by the control signal. Each erased cell may be indicative of the binary value "1", and the count signal is compared to a reference value (indicative of X/2) to generate a control signal determining whether the packet should undergo polarity inversion, and the packet is inverted (or not inverted) depending on the value of the control signal. The count signal can be generated for each packet of bits to be written to erased cells of an array (where the count signal indicates the number of bits in the packet having a particular value), and each packet is encoded in a manner determined by the corresponding count signal to reduce the power needed to write the encoded bits to the erased cells. Flag bits indicative of the encoding of each packet are generated, and the flag bits (as well as the encoded packets) are stored in cells of the flash memory array.

Other techniques for controlling memory power consumption are disclosed in IBM Technical Disclosure Bulletin Vol. 30, No. 1, June 1987, "Power Reduction Scheme with Data-Dependent Write", pgs. 304-305; IBM Technical Disclosure Bulletin 11-89, "Reduced Power for High Performance Memory", pgs. 415-416; and in IEEE publication "A High Performance Modular Embedded ROM Architecture", Marcello Duhalde et al. (1995), pgs. 1057-1060.

Improvements to these conventional techniques are needed to even further reduce power consumption, and the resulting heat load generated by power consumption, in currently available and future data storage devices and systems.

SUMMARY OF THE PREFERRED EMBODIMENTS

The foregoing and other problems are overcome, and other advantages are realized, in accordance with the exemplary embodiments of this invention.

In a first aspect thereof the exemplary embodiments of this invention provide a method to operate a memory device. The method includes, prior to overwriting a first unit of data at a location in a memory device with a second unit of data, determining if more energy is required to write the second unit of data than to write the second unit of data with at least one sub-unit thereof having bits that are inverted. If it is determined that less energy is required to write the second unit of data with the at least one sub-unit thereof having bits that are inverted, the method further includes overwriting the first unit of data with a modified second unit of data with the at least one sub-unit thereof having bits that are inverted, in conjunction with writing at least one bit for indicating a location in the modified unit of data of the sub-unit of data having the inverted bits.

In a further aspect thereof the exemplary embodiments of this invention provide an apparatus to operate a memory device that includes a memory control unit configured to determine, prior to overwriting a first unit of data at a location in a memory device with a second unit of data, if less energy is required to write the second unit of data than to write the second unit of data with at least one sub-unit thereof having bits that are inverted. The memory control unit is further configured, in response to a determination that less energy is required to write the second unit of data with the at least one sub-unit thereof having bits that are inverted, to send to the memory device a modified second unit of data with the at least one sub-unit thereof having bits that are inverted, in conjunction with an indicator field comprised of at least one bit that indicates a location in the modified unit of data of the sub-unit of data having the inverted bits.

In another aspect thereof the exemplary embodiments of this invention provide a computer readable memory medium that stores computer program instructions the execution of which result in operations that comprise: prior to overwriting a first unit of data at a location in a memory device with a second unit of data, determining if more energy is required to write the second unit of data than to write the second unit of data with at least one sub-unit thereof having bits that are inverted; if it is determined that less energy is required to write the second unit of data with the at least one sub-unit thereof having bits that are inverted, overwriting the first unit of data with a modified second unit of data with the at least one sub-unit thereof having bits that are inverted, in conjunction with writing at least one bit memory for indicating a location in the modified unit of data of the sub-unit of data having the inverted bits.

In a still further aspect thereof the exemplary embodiments of this invention provide a method to operate a memory control unit. The method includes reading current data stored in a memory location; comparing input data to be written with the current data and calculating a number of bit transitions that would occur if the new data overwrites the current data by performing an exclusive OR between the current data and the input data and summing a number of "1's" in the result of the exclusive OR, where the result of summing, sum1, represents the number of bit transitions that would occur if the input data overwrites the current data; comparing sum1 to a predetermined threshold and if sum1 is equal to or exceeds the threshold, negating all or part of the input data, performing an exclusive OR with the current data and calculating a second sum2, where if the value of sum2+1 of the negated input data is less than sum1, then the number of bit transitions will be reduced if the negated input data is written into the memory location; and setting at least one indicator bit in a corresponding indicator field to indicate if the input data is stored or if a negated form of all or a part of the input data is stored in the memory location.

In another aspect thereof the exemplary embodiments of this invention provide a method to operate a power advisor. The method includes, reading a first instruction set; reading a data bus; and reading register value(s) stored in at least one data register. This information is analyzed for energy usage purposes. If a set of instruction can provide the same result with a lower energy usage, the first instruction set is replaced with the lower power usage instruction set.

In a still further aspect thereof the exemplary embodiments of this invention provide an apparatus which is coupled to an instruction register, a data bus, and at least one data registers. The apparatus reads the first instruction set; reads the data bus; and reads register value(s) stored in the data register(s). The apparatus analyzes this information for energy usage purposes. If a set of instruction can provide the same result with a lower energy usage, the first instruction set is replaced with the lower power usage instruction set.

In another aspect thereof the exemplary embodiments of this invention provide a computer readable memory medium that stores computer program instructions the execution of which result in operations that comprise: reading a first instruction set; reading a data bus; and reading register value (s) stored in at least one data register. This information is analyzed for energy usage purposes. If a set of instruction can provide the same result with a lower energy usage, the first instruction set is replaced with the lower power usage instruction set.

In a still further aspect thereof the exemplary embodiments of this invention provide an apparatus. The apparatus has means for reading a first instruction set; reading a data bus; and reading register value(s) stored in at least one data register. The apparatus analyzes this information for energy usage purposes. If a set of instruction can provide the same result with a lower energy usage, the first instruction set is replaced with the lower power usage instruction set.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIG. 3B is a table showing various of examples of input data with current data having the same value, and reflects operation of the method of FIG. 3A.

FIG. 4 is a logic flow diagram that presents a non-limiting example of a method in accordance with this invention.

FIG. 5 depicts a data buffer that is managed in accordance with an exemplary embodiment of this invention.

DETAILED DESCRIPTION OF THE PREFERRED EMBODIMENTS

The use of the exemplary embodiments of this invention enables a reduction in the amount of energy required to store information in a memory device.

The exemplary embodiments of this invention employ techniques that reduce the number of transitions (1 to 0, or 0 to 1) in digital data and, as a result, the energy consumed when data is stored in a memory device. The use of the exemplary embodiments of this invention are advantageous for memory devices in which the energy to change the memory state is a dominant energy term. In a first exemplary embodiment a unit of data previously stored in a memory device is read prior to writing to determine if some portion of the unit of data, or a negated form of the portion of the unit of data, can be stored with fewer transitions and therefore lower energy. For a case where it is determined that some portion of the unit of data can be stored with fewer transitions, one or more indicators are stored to specify which portion, or portions, of the unit of data are stored in inverted form. The indicator or indicators are subsequently retrieved when the unit of data is read for use in restoring the unit of data to its original form.

Figure 1:
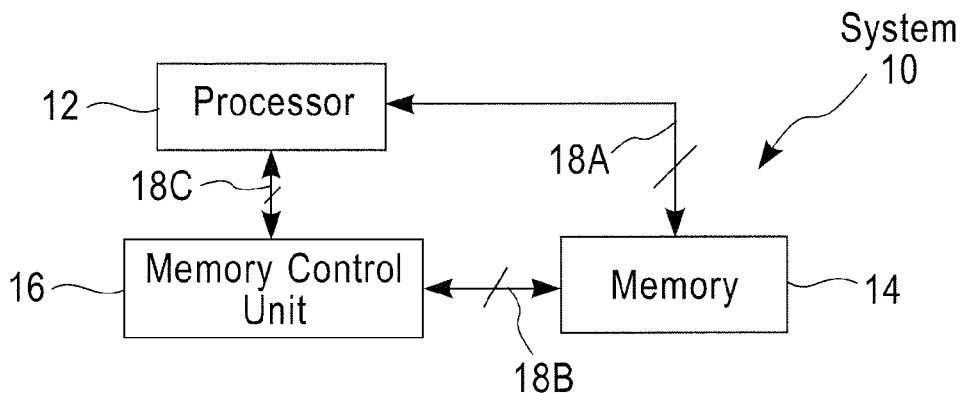
FIG. 1 is a simplified block diagram of a data processing system that is suitable for use in practicing this invention.

In another exemplary embodiment there is created a statistical bias for binary 0's in stored units of data such that the number of transitions is reduced when data is written to a memory location with previously stored data By way of introduction, FIG. 1 is a simplified block diagram of a data processing system 10 that is suitable for use in practicing this invention. The system 10 includes at least one processor 12 coupled with at least one memory 14. Associated with the memory 14 is a memory control unit 16 that is constructed and operated in accordance with the exemplary embodiments of this invention to analyze data to be stored in the memory 14 with the aim of reducing the number of transitions when the data is stored. For simplicity, the details of various buses 18A, 18B and 18C that interconnect these components are not shown (e.g., the details of address, data and control buses). Note that in some embodiments the processor 12 may be connected to the memory 14 only through the memory control unit 16, and in this case the bus 18A may not be present. Note also that in some embodiments all or part of the memory 14 may be remotely located from the processor 12, as may the associated memory control unit 16. In this case one or more of the buses 18A, 18B, 18C may be a local electrical or optical bus or can be remote such as a local area network (LAN), wired or wireless, or a wide area network, such as the internet.

The data processing system 10 may assume any suitable form, such as a mainframe computer, a workstation, a desk top (e.g., personal) computer, a laptop or notebook computer, or as a data processing system embedded in another device. The processor 12 may be any type of data processor, including one constructed from multiple components, or one constructed in an integrated form within a single integrated circuit, such as a microprocessor. The processor 12 may have a single core or a multi-core architecture. The memory 14 may be any type of suitable memory and may be embodied in one or more of semiconductor-based memory, such as semiconductor static random access memory (RAM) or dynamic RAM, or it may be embodied as a magnetic storage medium, such as disk or tape. In other embodiments the memory 14 may be a semiconductor-based technology based on magnetic principles (such as magnetoresistive RAM). In general, the exemplary embodiments of this invention are particularly useful for those types of data storage memories where some non-negligible amount of energy is needed to change the state of a data storage location, that is, to transition the data storage location from storing a zero bit to storing a one bit and/or from storing a one bit to storing a zero bit.

The memory control unit 16 may be integrated with the memory 14 or it may be a separate unit. It may also have additional functionality, such as operating as a DRAM control unit, or as a disk or a tape controller.

Note that in some embodiments all of the components shown in FIG. 1 may be integrated within the same integrated circuit. Note further that in some embodiments at least some of the memory 14 may be part of an internal memory of the processor 12, including (but not limited to) processor 12 RAM, registers and register files.

Figure 2:
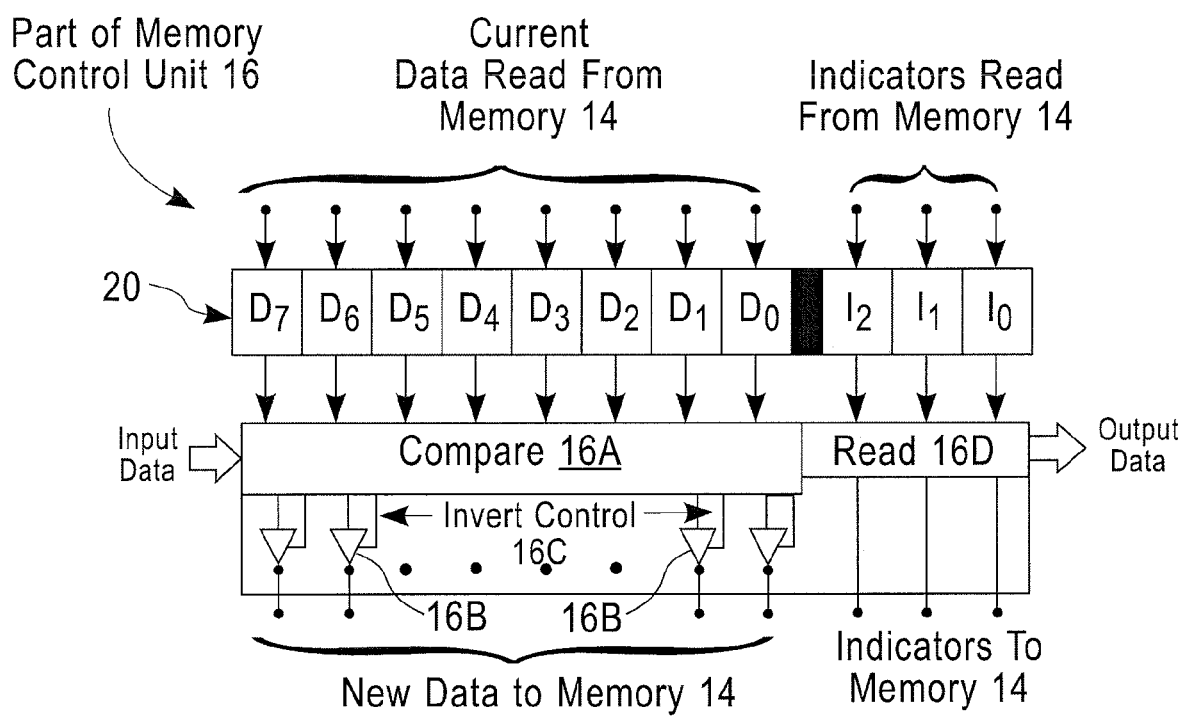
FIG. 2 is a simplified block diagram of a portion of the memory control unit of FIG. 1 in accordance with exemplary embodiments of this invention.

In accordance with an exemplary embodiment of this invention, and referring also to FIG. 2, the memory control unit 16 operates to introduce one or more indicator bits (indicators) into a data stream at certain intervals, based upon comparing data to be written to a particular location in the memory 14 (input data) to the data that is currently stored in the particular location (current data).

For example, assume a case where:
input Data=10000111
Current Data=11111111

A compare unit 16A of the memory control unit 16 operates, by example, to selectively control individual ones of a bank of inverters 16B to invert certain bits in the new data to be written to memory 14 to reduce the number of bit transitions and to generate indicator bits to represent the new data. In this non-limiting example, which assumes a data unit of length one byte (8-bits), a register 20 may be provided to hold the current data read from the memory 14 (e.g., all ones), and the input data, where D7 is a one, D6-D3 are zeroes, and D2-D0 are ones. Clearly, writing the input data directly to the memory 14 would cause a transition in four bits (D6-D3). To avoid this situation, the compare unit 16A detects that the number of bits that would be used for transition is equal to or exceeds some predetermined threshold value (e.g., two, three or four), and in response sets inverter control signal lines 16C to cause the inverters 16B in the paths of bits D7-D3 to invert the corresponding bits (assume that if an invert control signal line 16C is not set then the corresponding inverter 16B simply passes the bit through without inverting it, or that a switch simply bypasses the inverter). The result in this case is that the new data to memory 14 takes the form:
New Data=01111111, a result that causes a transition in only one of the eight bits (D7 in this example). Three indicator bits I2, I1, I0 can be used to indicate a starting point for the parity inversion in the new data. In one non-limiting example the sequence 000 indicates no changes are made and the remaining sequences can represent a number from 1 to 7, indicated which bit is the starting bit (e.g., 011 indicates the 3rd bit and above are changed, and 001 indicates that all bits are changed). In this case 12 is switched to 1, such that the indicator bits read as 100 to indicate that the fourth bit (D3) and above are inverted. Even with this additional bit switch, there is a net reduction in the total number of bits which are switched. As can be appreciated, the energy required to write the new data to memory is significantly reduced over the energy that would be required to write the data directly, without inverting any bits.

In order to be able to subsequently read this data from the memory 14 and restore it to its original form it is important to set an indicator for informing a read unit 16D of the memory control unit 16 of which bits were inverted (if any) when the data was stored. The indicator can take a number of different forms. In the illustrated example of FIG. 2 the most significant bit position in the data unit (e.g., counting from D7) to which the bit inversion was applied is encoded as a three bit value and sent as indicator bits to the memory 14 for storage in association with the stored data unit. In the non-limiting example given above the indicator value would be four (100). Subsequently, when this data unit is read-back from the memory 14 the read unit 16D performs the complementary operation to invert all of those bits up to the value of the indicator (bits D7-D4 in this example) so as to restore the data to its original form, thereby providing the output data to the processor 12 or some other component.

In this embodiment it is possible to add an additional indicator bit for designating whether the three indicator bits should be interpreted as counting from D0 (the LSB of the data unit) or from D7 (the MSB of the data unit).

In the example described thus far the boundary in the data unit where the inversion is applied can vary from data unit to data unit, depending on the result obtained by the compare unit 16A. In another embodiment the data unit may be partitioned into predetermined sub-units (e.g., 4-bit sub-units in the exemplary case described thus far), and then an indicator bit is provided for each sub-unit for indicating whether the corresponding sub-unit is inverted or is not inverted. As in the example provided above assume:
Input Data=1000 0111
Current Data=1111 1111, then applying the comparison threshold to each sub-unit may result in just the left-most sub-unit being inverted, so that:
New Data=0111 0111.

The indicator field in this case need only be 2-bits in length to represent the parity of each subunit and may have a value of Indicator=10.

Indicating that the left most sub-unit has been inverted.

In other embodiments each sub-unit may be 2-bits in width, and the indicator field then would be 4-bits in width for indicating whether each of the corresponding 2-bits of the data unit was inverted or was not inverted. Continuing with the foregoing example:
InputData=10 00 01 11
Current Data=11 11 11 11, then applying the comparison threshold (e.g., two in this case) to each sub-unit may result in just the second left-most sub-unit being inverted, so that:
New Data 10 11 01 11.

The indicator field in this case is only 4-bits in length and may have a value of
Indicator=0100.

Indicating that the second left-most sub-unit has been inverted.

In another embodiment the indicator bit field may be made as wide as the data unit (8-bits in this example), wherein individual bits in the indicator field are set or reset for indicating which corresponding bits in the data unit are inverted or not inverted, respectively.

As can be appreciated, there are numerous possible ways in which the embodiment of the invention can be implemented. As another example, and referring again to the base-8 indicator representation described first, two or more such 3-bit fields may be provided for indicating two or more locations where the bit inversion is selectively applied. In addition, the inverters 16B could be replaced by certain types of logic gates, such as exclusive ORs, the operation of which would result in selectively inverting desired ones of the bits to be written to the memory 14 so as to reduce the number of transitions.

Further, it should be appreciated that the exemplary embodiments of this invention are not limited for use with only data units that are 8-bits in width, as the foregoing description can apply to a data unit of any desired with (e.g., 64-bits, 256-bits, etc.).

Figure 3A:
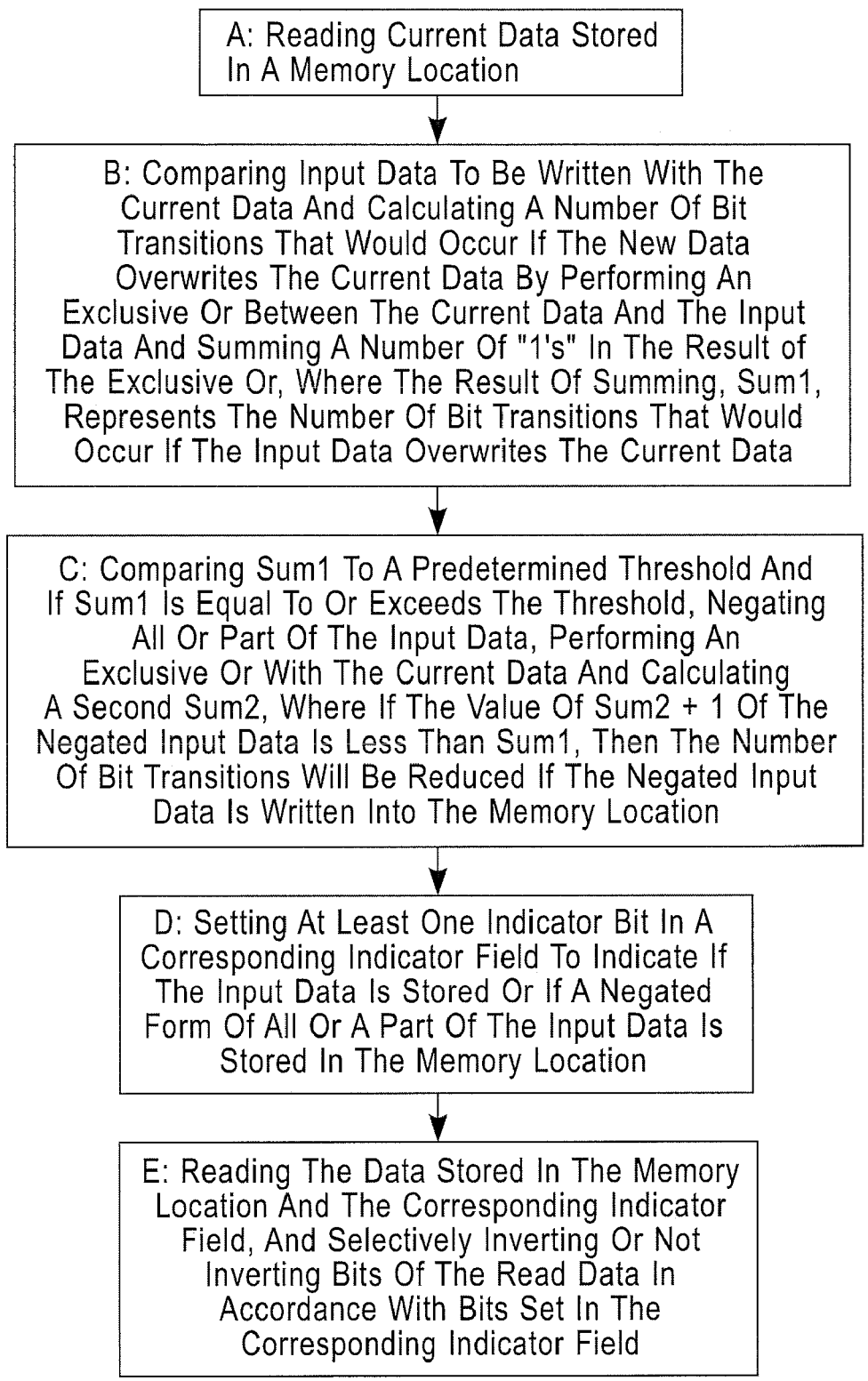
FIG. 3A is a logic flow diagram that presents a non-limiting example of a method of operating the memory control unit of FIG. 1.

Referring to FIG. 3A, a non-limiting example of the operation of the memory control unit 16 is now provided.

Step A: reading current data stored in a memory location;

Step B: comparing input data to be written with the current data and calculating a number of bit transitions that would occur if the new data overwrites the current data by performing an exclusive OR between the current data and the input data and summing a number of "1's" in the result of the exclusive OR, where the result of summing, sum1, represents the number of bit transitions that would occur if the input data overwrites the current data;

Step C: comparing sum1 to a predetermined threshold and if sum1 is equal to or exceeds the threshold, negating all or part of the input data, performing an exclusive OR with the current data and calculating a second sum2, where if the value of sum2+1 of the negated input data is less than sum1, then the number of bit transitions will be reduced if the negated input data is written into the memory location; and Step D: setting at least one indicator bit in a corresponding indicator field to indicate if the input data is stored or if a negated form of all or a part of the input data is stored in the memory location.

A further Step E includes subsequently reading the data stored in the memory location and the corresponding indicator field, and selectively inverting or not inverting bits of the read data in accordance with bits set in the corresponding indicator field.

In Step B, the energy required to write the data is given by $E_{Write}*Sum+E_{Read}*8$.

An example of the foregoing is shown in FIG. 3B, where the example assumes that the current data is all zeroes and that the input data ranges in value from 250 to 255. In this example, one indicator bit is used with an eight bit word. The addition of one bit to indicate the change in parity is shown in Sum Xor+1, which represents the total number of bits which will be switched after the parity change.

FIG. 4 is descriptive of a method to operate a memory device in accordance with the exemplary embodiments of this invention. The method includes at Block 4A, prior to overwriting a first unit of data at a location in a memory device with a second unit of data, determining if more energy is required to write the second unit of data than to write the second unit of data with at least one sub-unit thereof having bits that are inverted. If it is determined that less energy is required to write the second unit of data with the at least one sub-unit thereof having bits that are inverted, the method further includes at Block 4B overwriting the first unit of data with a modified second unit of data with the at least one sub-unit thereof having bits that are inverted, in conjunction with writing at least one bit for indicating a location in the modified unit of data of the sub-unit of data having the inverted bits.

The various blocks shown in FIGS. 3A and 4 may be viewed as method steps, and/or as operations that result from execution of computer program code stored in a computer-readable medium, and/or as a plurality of coupled logic circuit elements constructed to carry out the associated function(s). Note as well that some or all of the functionality of the memory control unit 16 shown in FIG. 2 can be implemented by execution of computer program code stored in a computer-readable medium either alone or in combination with hardware circuitry.

It should also be noted that the indicator field can be stored in association with the corresponding data unit in the same memory 14, or it may be stored separately in another memory of the same or a different type that is addressed and read in synchronism with addressing and reading the (data) memory 14.

Note further that the application of this embodiment of the invention provides a level of security for the data stored in the memory 14, for without the corresponding information stored in the indicator fields it would become difficult to read out and interpret the data (having various bits selectively inverted throughout).

The embodiments of this invention pertain as well to hard disk drives with patterned media.

The exemplary embodiments of this invention are applicable to hard disk drives where long streams of data are stored in sectors. Current drives store approximately 512 bytes in a sector, and sectors are typically rewritten in blocks. However, future disk drive media are projected to be patterned in such a way that each bit resides in a separate discrete portion of the patterned media and can be written individually. By reducing the number of transitions 1 to 0, or vice versa, the write current can be reduced. In a lengthy data stream, the indicator bits can be applied.

A sector is the basic unit of data storage on a hard disk. The term "sector" emanates from a mathematical term referring to a pie-shaped angular section of a circle, bounded on two sides by radii and the third by the perimeter of the circle. In essence, a hard disk is comprised of a group of predefined sectors that form a circle, and a given circle of predefined sectors is defined as a single track. A group of concentric circles (tracks) define a single surface of a disk's platter. Early hard disks had the same number of sectors per track location and typically the number of sectors in each track was fairly standard between models. When a hard disk is prepared with its default values, each sector is capable of storing 512 bytes of data. Current advances in hard disk drive technology have allowed the number of sectors per track, or SPT, to vary significantly.

The exemplary embodiments of this invention can be used with advantage in both hard disks having a fixed number of sectors per track and in hard disks having a variable number of sectors per track. The exemplary embodiments of this invention can also be used to advantage in hard disk drives based on patterned media, wherein individual bits can be separately recorded (as opposed to recording at least an entire sector per write operation).

The indicator field for a sector of data may be stored at the beginning or end of the sector, as desired. Alternatively, one or more sectors of a given track may be dedicated to storing the indicator fields for all of the sectors in the track. Other arrangements for storing the indicator information relative to the stored disk data can also be employed.

Note that in a data storage embodiment implemented using an array of disk drives, such as a redundant array of inexpensive disks (RAID) embodiment, and as a non-limiting example, eight disk drives may be used for storing the data, while a ninth disk drive may be used for storing the indicator information, possibly in conjunction with error detection and correction information. A number of other RAID-type organizations are possible.

The exemplary embodiments of this invention can be used in other ways to pre-process data to be written to memory. For example, in some applications data can be frequently rewritten. One non-limiting example is an application where transaction information for a plurality of clients is archived during the course of a day. Referring to FIG. 5, a data buffer 30, such as a first in-first out (FIFO) buffer, can be provided for storing the client information before it is sent to the memory 14. By reading and preprocessing the information stored in the data buffer 30, the number of transitions can be reduced in the data that is actually written to the memory 14. For example, recognizing that the previous data byte #2 matches the current data, the transitions do not need to be reversed, as would occur if data byte #2 was first written to the memory 32, followed by data byte # 1, then followed by the current data byte.

Current Data 00001111
DataByte#1 11111111
DataByte#2 00001111

In this case, and upon detecting that the current data matches data byte #2, only the current data need be written, and not data bytes #2 and #1 (or alternatively only data byte #2 is sent to the memory 14, and data byte #1 and the current data byte may be erased).

Note that while the buffer 30 is described as storing data to be written to the same location in the memory 32, in other embodiments the buffer 30 may store enqueued commands to be applied to an arithmetic logic unit (ALU) of the processor 12.

Figure 6:
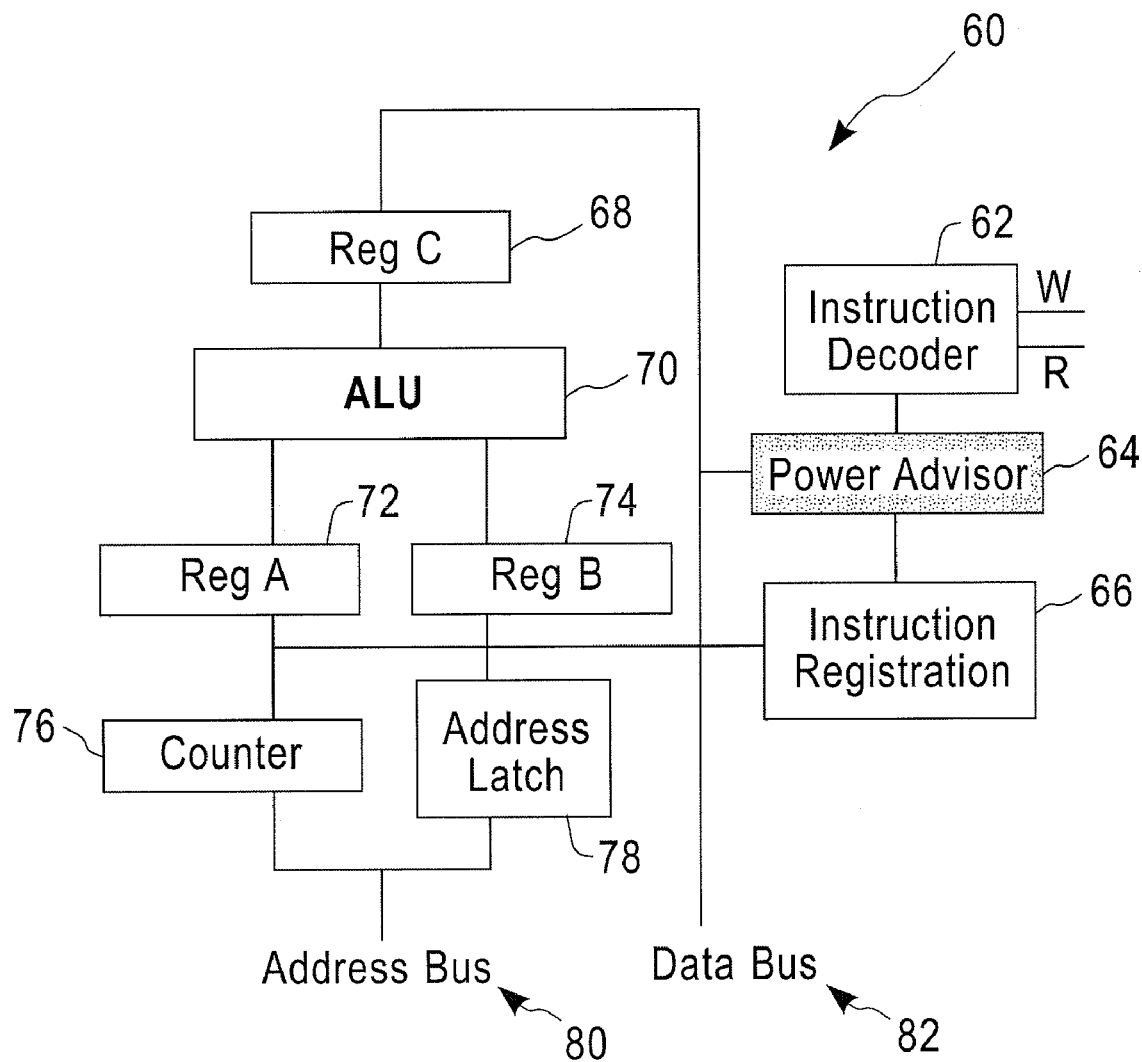
FIG. 6 is a simplified block diagram of a portion of a data processor, such as a microprocessor, that is suitable for use in practicing this invention.

A simplified view of a portion of a data processor, such as a microprocessor 60, is shown in FIG. 6, which includes an ALU 70, registers A 72, B 74 and C 68, instruction decoder 62, instruction register 66, counter 76 and address latch 78. Both the counter 76 and the address latch 78 are connected to the address bus 80. The microprocessor 60 can execute a set of instructions, a subset of a typical instruction set is shown below.

LOAD A—Load a value into register A from a memory address
LOAD B—Load a value into register B from a memory address
CON A—Load a constant value into register A
CON B—Load a constant value into register B
CON C—Load a constant value into register C
SAVE B—Save the value in register B to a memory address
SAVE C—Save the value in register C to a memory address
ADD—Add the value in register A and the value in register B and store the result in register C
SUB—Subtract the value in register A from the value in register B and store the result in register C
MUL—Multiply the value in register A and the value in register B and store the result in register C
DIV—Divide the value in register A by the value in register B and store the result in register C A program is a set of sequential instructions. The microprocessor 60 consumes energy to change the state of a bit within the circuitry of the ALU 70 or registers 68, 72, and 74. Methods which can reduce the number of bits which are changed can reduce the overall energy of the computation. One method to accomplish this is to include a power advisor 64 in the microprocessor 60 which examines the instructions and data bus 82 to minimize the number of transitions and therefore power.

In one non-limiting example, adding 1 and 255 results in changing 0000 0000 1111 1111 to 0000 0001 0000 0000 requiring 9 bits to transition from 0 to 1 or 1 to 0. This change may be preformed by the instruction set below:

LOAD A 200 (load register A with the value in memory location 200-255 in this case)
CON B 1 (load the number "1" into Register B)
ADD (add the value in register A and the value in register B, store in Register C)

The power advisor 64 monitors the instruction register 66, data bus 82 and registers 68, 72, and 74 may replace a certain instruction sequence of instructions with a reduced energy instruction set, for example using:

CON C 256 (load the number "256" in Register C)

This instruction (CON C 256) eliminates or reduces processing which would occur in the ALU 70, and bit changes in registers A 72 and B 74, thus providing energy savings.

Figure 7:
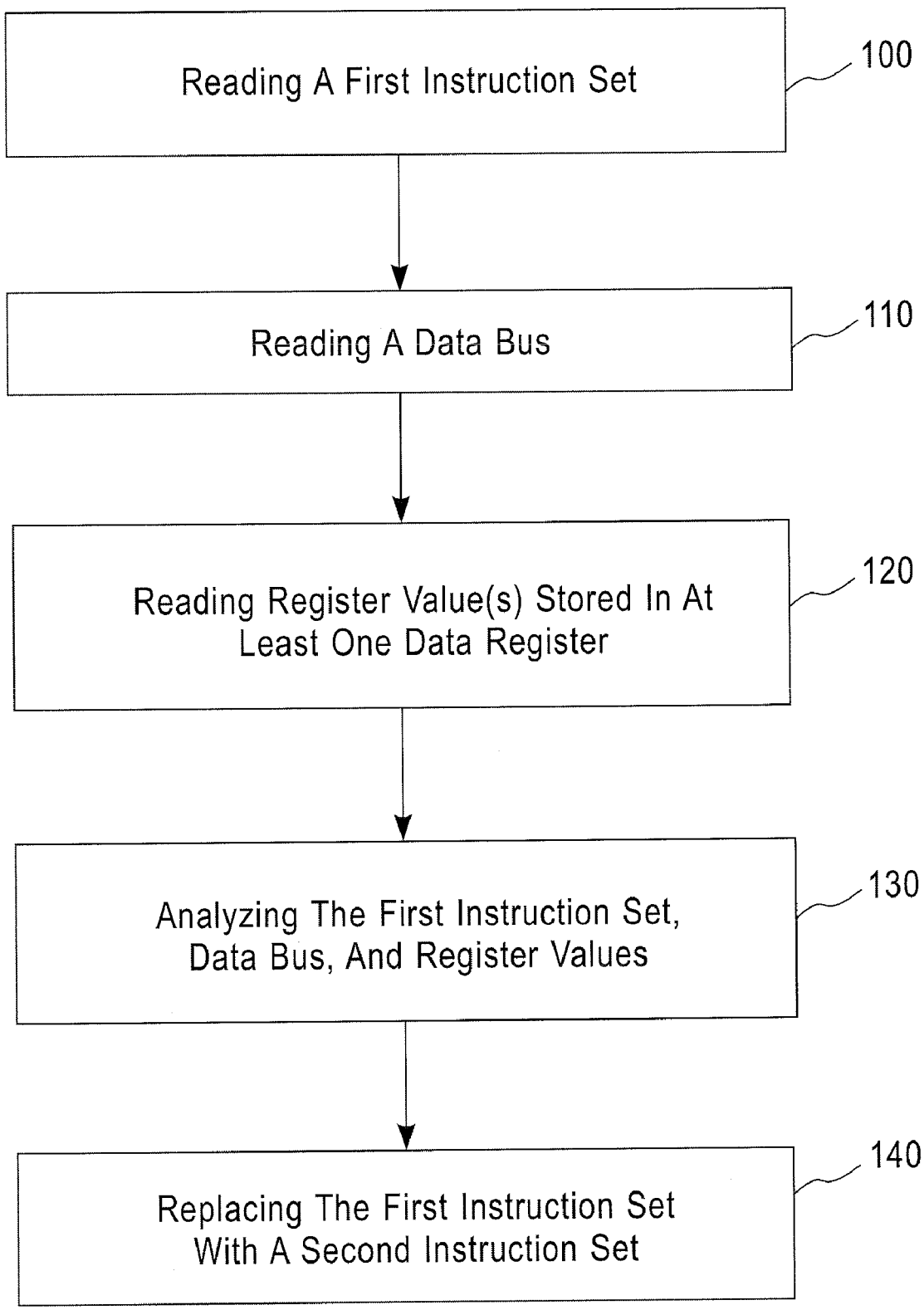
FIG. 7 is a logic flow diagram that presents a non-limiting example of a method in accordance with this invention.

FIG. 7 is descriptive of a method to operate the power advisor 64 in accordance with the exemplary embodiments of this invention. The method includes: at Block 100, reading a first instruction set; at Block 110, reading a data bus; and at Block 120, reading register value(s) stored in at least one data register. The method further provides in Block 130, that the power advisor 64 analyzes the first instruction set, data bus, and register values for energy usage purposes. At Block 140, if a second instruction set is determined to provide the same result as the first instruction set with a lower energy usage, it is used to replace the first instruction set. The resulting instruction set can then be applied to the ALU 70.

The method to operate the power advisor 64 could be implemented solely on hardware, or in software, including firmware, or as a combination of hardware and software, including firmware.

The exemplary embodiments of this invention can also be implemented through the use of a power hierarchy. Related in some respects to the preceding embodiment, power consumption is reduced, or is reduced further, by the use of the memory buffer 30, which preferably consumes less power per transition than the memory 14, to hold the data to be stored.

Various modifications and adaptations may become apparent to those skilled in the relevant arts in view of the foregoing description, when read in conjunction with the accompanying drawings and the appended claims. For example, the use of other similar or equivalent memory devices, circuit and system architectures, data widths and the like may be attempted by those skilled in the art. However, all such and similar modifications of the teachings of this invention will still fall within the scope of this invention.

As a further example, in a system/memory architecture wherein it is possible to use other than two level logic (e.g., where it is possible to use three level logic levels) then the indicator bits may be placed directly in the data stream and decoded as such as the data is read out of the memory device. In this case, and by example, the data may be stored using two of the logic levels, while the indicator bit(s) are stored using a third logic level. In this case the indicator fields may be considered to be distributed throughout the data that is stored and read back.

Furthermore, some of the features of the examples of this invention may be used to advantage without the corresponding use of other features. As such, the foregoing description should be considered as merely illustrative of the principles, teachings, examples and exemplary embodiments of this invention, and not in limitation thereof.

What is claimed is:

1. A method to operate a memory device, comprising:
   prior to overwriting a first unit of data at a location in a memory device with a second unit of data, determining, based at least part on the first unit of data, if more energy is required to write the second unit of data than to write a modified second unit of data,
   where the modified second unit of data comprises the second unit of data with at least one sub-unit thereof having bits that are inverted and at least one other sub-unit thereof having bits that are not inverted;
   in response to determining that less energy is required to write the modified second unit of data, overwriting the first unit of data with the modified second unit of data and writing at least one bit for indicating a location in the modified unit of data of the at least one sub-unit having the inverted bits.

2. The method of claim 1, further comprising subsequently reading the modified second unit of data and the at least one bit, and inverting bits of any sub-unit thereof indicated as having inverted bits to provide output data.

3. The method of claim 1, where a unit of data comprises N bits, where N is an integer, and where a sub-unit comprises from one bit to N bits.

4. The method of claim 1, where the at least one bit is comprised of a plurality of bits that are encoded as a group for indicating a value.

5. The method of claim 1, where the at least one bit is comprised of a plurality of bits, where individual ones of the plurality of bits specify a corresponding individual one of a plurality of sub-units.

6. The method of claim 1, where the memory device is comprised of a semiconductor-based memory device.

7. The method of claim 1, where the memory device is comprised of a disk-based or a tape-based memory device.

8. The method of claim 1, where the at least one bit is written to the same memory device that the modified second unit of data is written.

9. The method of claim 1, where the at least one bit is written to a different memory device than the memory device to which the modified second unit of data is written.

10. The method of claim 1, further comprising buffering the second unit of data prior to writing it to the memory device.

11. An apparatus to operate a memory device, comprising:
    processor configured to determine, prior to overwriting a first unit of data at a location in a memory device with a second unit of data, based at least in part on the first unit of data, if less energy is required to write the second unit of data than to write a modified second unit of data,
    where the modified second unit of data comprises the second unit of data with at least one sub-unit thereof having bits that are inverted and at least one other sub-unit thereof having bits that are not inverted,
    said processor further configured, in response to a determination that less energy is required to write the modified second unit of data to send to the memory device the modified second unit of data, in conjunction with an indicator field comprised of at least one bit that indicates a location in the modified second unit of data of the sub-unit having the inverted bits.

12. The apparatus of claim 11, said processor is further configured, in response to reading of the modified second unit of data and the corresponding indicator field, to provide output data after inverting the bits of any sub-unit thereof indicated as having inverted bits.

13. The apparatus of claim 11, where a unit of data comprises N bits, where N is an integer, and where a sub-unit comprises from one bit to N bits.

14. The apparatus of claim 11, where the indicator field is comprised of a plurality of bits that are encoded as a group for indicating a value.

15. The apparatus of claim 11, where the indicator field is comprised of a plurality of bits, where individual ones of the plurality of bits specify a corresponding individual one of a plurality of sub-units.

16. The apparatus of claim 11, where the memory device is comprised of a semiconductor-based memory device.

17. The apparatus of claim 11, where the memory device is comprised of a disk-based or a tape-based memory device.

18. The apparatus of claim 11, where the indicator field is written to the same memory device that the modified second unit of data is written.

19. The apparatus of claim 11, where the indicator field is written to a different memory device than the memory device to which the modified second unit of data is written.

20. The apparatus of claim 11, embodied in an integrated circuit.

21. The apparatus of claim 11, embodied in an integrated circuit with a data processor and with the memory device.

22. The apparatus of claim 21, where the memory device comprises part of the data processor.

23. The apparatus of claim 11, further comprising a buffer to queue the second unit of data prior to writing it to the memory device.

24. A memory medium that stores computer program instructions the execution of which result in operations that comprise:
    prior to overwriting a first unit of data at a location in a memory device with a second unit of data, determining, based at least in part on the first unit of data, if more energy is required to write the second unit of data than to write a modified second unit of data,
    where the modified second unit of data comprises the second unit of data with at least one sub-unit thereof having bits that are inverted and at least one other sub-unit thereof having bits that are not inverted;
    in response to determining that less energy is required to write the modified second unit of data, overwriting the first unit of data with the modified second unit of data and writing at least one bit for indicating a location in the modified unit of data of the at least one sub-unit having the inverted bits.

25. The memory medium of claim 24, further comprising an operation of, in response to subsequently reading the modified second unit of data and the at least one bit, inverting bits of any sub-unit thereof indicated as having inverted bits to provide output data.

26. The memory medium of claim 24, where a unit of data comprises N bits, where N is an integer, and where a sub-unit comprises from one bit to N bits.

27. The memory medium of claim 24, where the at least one bit is comprised of a plurality of bits that are encoded as a group for indicating a value.

28. The memory medium of claim 24, where the at least one bit is comprised of a plurality of bits, where individual ones of the plurality of bits specify a corresponding individual one of a plurality of sub-units.

29. The memory medium of claim 24, where the memory device is comprised of a semiconductor-based memory device.

30. The memory medium of claim 24, where the memory device is comprised of a disk-based or a tape-based memory device.

31. The memory medium of claim 24, where the at least one bit is written to the same memory device that the modified second unit of data is written.

32. The memory medium of claim 24, where the at least one bit is written to a different memory device than the memory device to which the modified second unit of data is written.

33. The memory medium of claim 24, further comprising an operation of buffering the second unit of data prior to writing it to the memory device.

34. A method to operate a memory control unit, comprising:

reading current data stored in a memory location;

comparing input data to be written with the current data and calculating a number of bit transitions that would occur if the input data overwrites the current data by performing an exclusive OR between the current data and the input data and summing a number of "1's" in the result of the exclusive OR, where the result of summing, sum1, represents the number of bit transitions that would occur if the input data overwrites the current data;

comparing sum1 to a predetermined threshold;

in response to determining that sum1 is equal to or exceeds the threshold, generating negated input data by negating at least one portion of the input data, where at least one other portion of the input data is not negated;

comparing the negated input data with the current data and calculating a number of bit transitions that would occur if the negated input data overwrites the current data by performing an exclusive OR between the current data and the negated input data and summing a number of "1's" in the result of the exclusive OR, where the result of summing, sum2, represents the number of bit transitions that would occur if the negated input data overwrites the current data; and in response to determining that a value of sum2+1 is less than sum1, setting at least one indicator bit in a corresponding indicator field to indicate a location of the negated at least one portion of the negated input data stored in the memory location.

35. The method of claim 34, further comprising subsequently reading the data stored in the memory location and the corresponding indicator field, and selectively inverting or not inverting bits of the read data in accordance with bits set in the corresponding indicator field.

* * * * *